METHOD OF FORMING MULTILAYER CIRCUIT BOARDS HAVING WELDABLE PROJECTIONS EXTENDING THEREFROM

Filed Oct. 23, 1964 2 Sheets-Sheet 1

INVENTORS.
PHILIP E. HERMANN
BY RICHARD J. BRUENEMAN
Alden D. Redfield
Charles M. Hogan
ATTORNEYS.

Jan. 23, 1968 P. E. HERMANN ET AL 3,364,566

METHOD OF FORMING MULTILAYER CIRCUIT BOARDS HAVING WELDABLE PROJECTIONS EXTENDING THEREFROM

Filed Oct. 23, 1964 2 Sheets-Sheet 2

INVENTORS.
PHILIP E. HERMANN
BY RICHARD J. BRUENEMAN

Alden D. Redfield
Charles M. Hogan
ATTORNEYS.

3,364,566

METHOD OF FORMING MULTILAYER CIRCUIT BOARDS HAVING WELDABLE PROJECTIONS EXTENDING THEREFROM

Philip E. Hermann, Fort Wayne, Ind., and Richard J. Brueneman, Cincinnati, Ohio, assignors to Avco Corporation, Cincinnati, Ohio, a corporation of Delaware

Filed Oct. 23, 1964, Ser. No. 406,020

5 Claims. (Cl. 29—626)

The present invention relates to encapsulated circuitry, and, more specifically, the invention comprises improved means and methods for making connections to printed circuit boards.

A primary object of the invention is to provide printed circuitry connections which are adaptable to planar welding.

Another object of the invention is to provide printed circuit boards with connections having maximum repair capabilities.

Another important object of the invention is to provide printed circuit boards having weldable tabs suitable for use with series or pinch welding.

Other objects of the invention include the provision of connections independent of the bonding strength of the printed circuitry.

The invention provides a printed circuit board construction having connections which are weldable, solderable, and repairable. The method of construction offers the advantages of improved terminal anchorage and duplication of tabs and rapid die assembly of circuit board packages.

For a better understanding of the invention, together with other and further objects, advantages, and capabilities thereof, reference is made to the following description of the appended drawings, in which.

Figure 3:
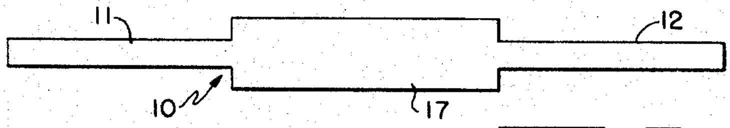
FIGS. 3 and 4 are top plan views of preferred and alternate embodiments, respectively, of a tab-carrying member in accordance with the invention.
Figure 4:
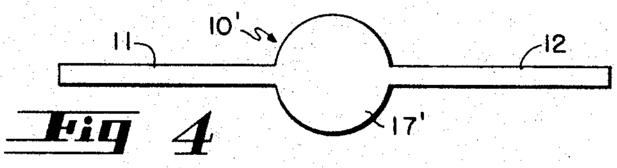
Figure 5:
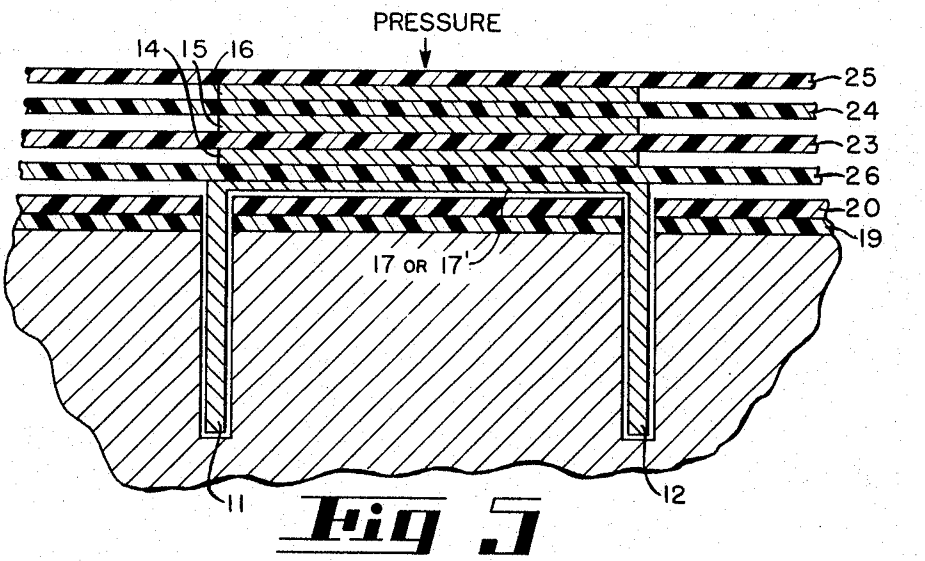
FIGS. 5, 6, and 7 are successive sectional views of the work product during various stages of the process in accordance with the invention, as described in detail below.

Attention is now particularly invited to three features of a typical finished product in accordance with the invention. The first is the weld-tab-carrying member 10 (FIG. 3) or 10' (FIG. 4), which carries integral tabs 11 and 12 (FIG. 1) and is in contact with the plating 13, which plating is in turn in contact with an edge of each of circuit patterns 14, 15, and 16. Second, the body portion 17 or 17' (FIGS. 3, 4) of each weld-tab-carrying member is imbedded in epoxy (FIG. 5). Moreover, the plating 13 extends through such body member (FIG. 1).

Figure 1:
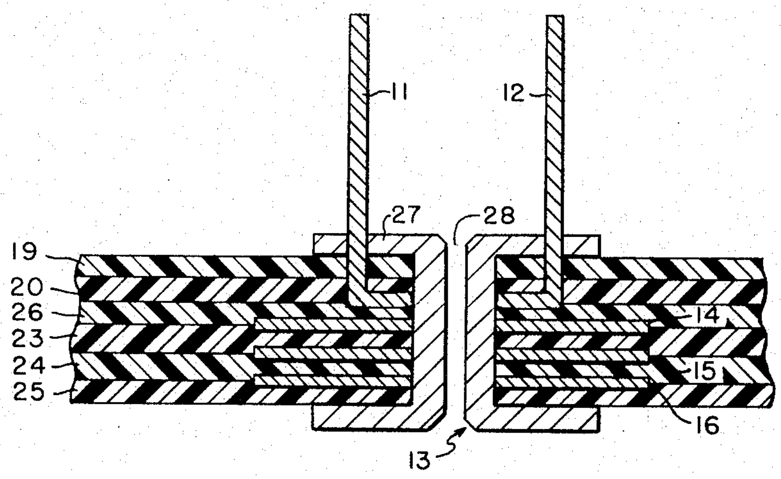
FIG. 1 is a sectional view through a completed printed circuit board with weldable tabs in accordance with the invention.

The present invention is of utility for use with one, two, or more circuit boards, and three are shown in FIGS. 1 and 5 for purposes of illustration.

It will be understood that the individual circuit boards 23, 24, and 25, each consisting of a B-stage epoxy layer carrying one of the etched copper circuit patterns 4, 15, and 16, respectively, are prepared in accordance with conventional photo-etching techniques.

Figure 2:
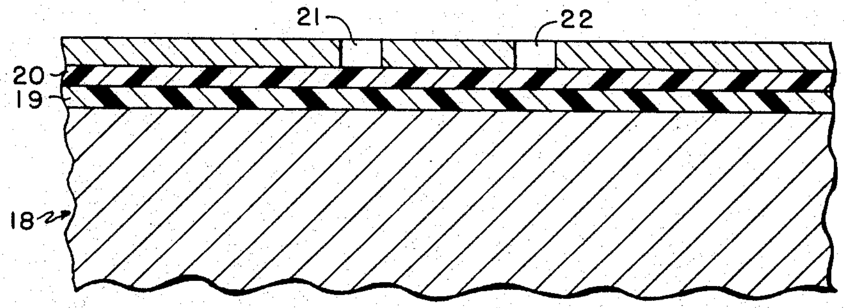
FIG. 2 is a sectional view showing a stage in the process of fabrication prior to the placement of the tab-carrying member.

The discussion now proceeds to the processing of the product shown in FIG. 1. Referring now to FIG. 2, there are succesively stacked on metal platen 18, in the order named: a layer 19 of cured epoxy and a layer 20 of B-stage epoxy. A template with holes 21 and 22 is placed on top of the stack. Next, holes in alignment with the holes 21 and 22 of the template are drilled through the superimposed layers 20 and 19 and into the platen (FIGS. 2 and 5). At this point tabs on the preferred carrier member 10 are bent at right angles to the body 17 (FIG. 3), and the tabs are inserted through the holes in the layers and into the holes in the platen, as shown in FIG. 5.

After insertion of the weld-tabs 11, 12 into the aligned holes prepared as per FIG. 2, a layer of B-stage epoxy 26 is placed on top of the FIG. 2 work product, and then the circuit boards 23, 24, and 25 are successively superimposed as shown in FIG. 5 to form a stack. The entire stack is placed in a jig and pressed and cured and formed into a solid mass by the application of heat and pressure in the direction shown. The tab-bearing member 10 sinks into the epoxy during the curing and becomes firmly anchored in position relative to the printed circuit patterns.

The weld-tab-carying member is formed of some material such as nickel, Kovar, Dumet, which will weld readily and endure normal mechanical handling.

One imbedded terminal 17, 11, 12 is described for simplicity in exposition, but it will be understood that the same process may be used for any number of welded tabs and for either single or multiple internal connections to printed circuit patterns.

Now making reference to the printed circuit patterns and the connections thereto, the discussion of the manufacturing process proceeded as far as the end of the description of FIG. 5, before some parenthetical matters were presented. At the conclusion of the FIG. 5 stage of the process there results an integral encapsulated circuit package. The next steps in the process are those which perfect the connection from the tab-carrying member to one or more or all (as in this case) of the circuit patterns 13, 14, and 15.

Figure 6:
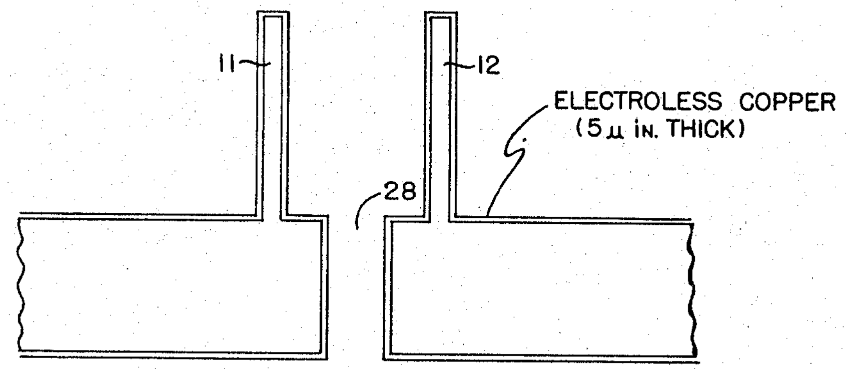
Figure 7:
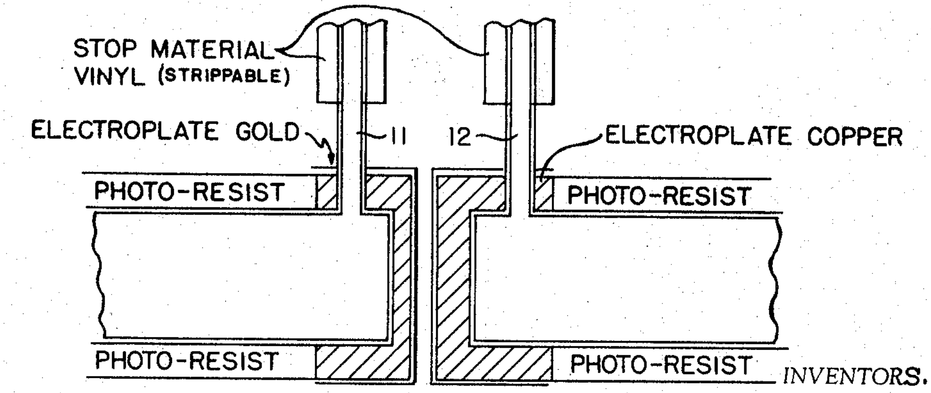

First a hole 28 is mechanically jig-drilled through the package and between the tabs. An eyelet-shaped conductor 27 is then plated through the hole 28 in the following manner: First, electroless copper (FIG. 6) is deposited on the tabs and over the entire surface of the hole 28 and over the top and bottom surfaces of the package. Next the top and bottom surfaces of the package located laterally of the locus of the eyelet 27 are coated with photo-resist (FIG. 7). Then the uncoated surfaces are copper-plated to form the eyelet 27. Finally the eyelet is gold-plated and the electroless copper is removed by a sodium cyanide etch from the weldable tabs. The eyelet 27 has a copper base about .001 inch thick, with a few millionths thick gold plate overlay. Prior to the electroplating step, vinyl stop material is placed along the tabs. After the gold-plating, the photo-resist and stop-off material are removed from the package and tabs, respectively.

The eyelet 27 conductively edge-contacts each of the circuit patterns 14, 15, and 16, as well as the body 17 of the tab carrier. Additionally, the eyelet contacts the tabs. Parenthetically, it will be understood that one tab is sufficient to establish a weldable contact, and that provision for extra tabs is intended for convenience in repair.

It will be seen from the foregoing that the invention provides means, readily adapted to mass production, for the incorporation of multiple tab terminals into stacked or laminated electrical circuitry.

This invention is of utility wherever terminals are inserted into blocked laminated circuitry. It offers the advantages of improved terminal anchorage, positive electrical connection to internal encapsulated circuitry, one or more extra tabs for repairs or the remarking of connections, and rapid die assembly of composite circuit blocks.

While there has been shown and described what is at present considered to be the preferred embodiment of the invention, it will be understood by those skilled in the art that various changes and modifications may be made therein without departing from the scope of the invention as defined by the appended claims.

We claim:

1. The method of establishing a connection to a printed circuit board which comprises the steps of:
forming a weldable tab-carrier as a body with two outstanding tabs,
bending said tabs out of the plane of the body,
forming apertures in a first layer of epoxy material in positions to receive said tabs,
mechanically projecting said tabs through said apertures so that said tab carrier abuts said first layer of material,
superimposing a second layer of imperforate epoxy material over said first layer of material thereby sandwiching said tab carrier between said layers,
superimposing on said sandwiched epoxy material a plurality of printed circuit boards each comprising a metallic circuit pattern and a B-stage epoxy base,
pressing said layers of material together and applying heat for anchoring said tab carrier between the layers of said epoxy material for forming said epoxy material and tab carrier and circuit board into an integral package,
drilling a hole through said package to provide a passage in edge-contact with said body and the circuit patterns,
and finally copper-plating said passage.

2. The method of establishing a connection to a printed circuit board which comprises the steps of:
forming a weldable tab-carrier as a body with a plurality of outstanding tabs,
bending said tabs out of the plane of the body,
forming apertures in a first layer of plastic material in positions to receive said tabs,
mechanically projecting said tabs through said apertures so that said tab carrier abuts said first layer of plastic material,
superimposing a second layer of imperforate plastic material over said first layer of material thereby sandwiching said tab carrier between said layers,
superimposing on the sandwiched material a printed circuit board comprising a metallic circuit pattern and a plastic base,
pressing said layers of plastic material together and applying heat for anchoring said tab carrier between the layers of said plastic material and forming said plastic material and tab carrier in circuit board into an integral package,
drilling a hole through said package to provide a passage in edge-contact with said body and said circuit pattern,
and finally plating said passage.

3. The method of establishing a connection to a printed circuit board which comprises the steps of:
forming a body with weldable projections,
mechanically extending said projection through a first layer of epoxy material, superimposing a second layer of imperforate epoxy material over said first layer of material thereby sandwiching said body between said layers,
superimposing on said epoxy material at least one printed circuit board comprising a metallic circuit pattern and a B-stage epoxy base,
pressing said layers of material together and applying heat for anchoring said tab carrier between the layers of said epoxy material and forming said epoxy material and tab carrier and circuit board into an integral package,
drilling a hole to provide a passage in edge-contact with said body and said circuit pattern,
and finally plating said passage.

4. The method of establishing a connection to a printed circuit board which comprises the steps of:
forming a body with weldable projections,
mechanically extending said projections through a first layer of plastic material, superimposing a second layer of imperforate plastic material over said first layer of material thereby sandwiching said body between said layers,
superimposing on said sandwiched plastic material at least one printed circuit board comprising a metallic circuit pattern and a plastic base,
pressing said layers of material together and applying heat for anchoring said body between the layers of said plastic material and forming said plastic material and tab carrier and circuit board into an integral package,
drilling a hole to provide a passage in edge-contact with said body and said circuit pattern,
and finally plating said passage.

5. The method of establishing a connection to a printed circuit board which comprises the steps of:
forming a weldable tab-carrier as a body with two outstanding tabs,
bending said tabs out of the plane of the body,
drilling apertures in a first layer of epoxy material,
mechanically projecting said tabs through said apertures, superimposing a second layer of imperforate epoxy material over said first layer of material thereby sandwiching said tab carrier between said layers,
superimposing on said epoxy material at least one printed circuit board comprising a metallic circuit pattern and a B-stage epoxy base,
pressing said layers of material together and applying heat for anchoring said tab carrier between the layers of said epoxy material and forming said epoxy material and tab carrier and circuit board into an integral package,
drilling a hole through said package to provide a passage in edge-contact with said body and said circuit pattern,
copper-plating said passage,
and finally gold-plating said passage.

References Cited

UNITED STATES PATENTS

| | | | |
|---|---|---|---|
| 3,322,880 | 5/1967 | Bedell et al. | 174—68.5 |
| 3,102,213 | 8/1963 | Bedson et al. | 174—68.5 |
| 3,151,278 | 9/1964 | Elarde | 174—68.5 X |

DARRELL L. CLAY, *Primary Examiner.*